(12) United States Patent
Zhang et al.

(10) Patent No.: US 12,148,650 B2
(45) Date of Patent: *Nov. 19, 2024

(54) THERMAL DIFFUSER FOR A SEMICONDUCTOR WAFER HOLDER

(71) Applicant: Watlow Electric Manufacturing Company, St. Louis, MO (US)

(72) Inventors: Sanhong Zhang, Ballwin, MO (US); Kevin Ptasienski, O'Fallon, MO (US); Martin Wallinger, Abtenau (AT); Blake Parkinson, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/983,643

(22) Filed: Nov. 9, 2022

(65) Prior Publication Data

US 2023/0139249 A1    May 4, 2023

Related U.S. Application Data

(63) Continuation of application No. 16/552,790, filed on Aug. 27, 2019, now Pat. No. 11,515,190.

(51) Int. Cl.
*H01L 21/683* (2006.01)
*C23C 24/04* (2006.01)
*H05B 3/14* (2006.01)

(52) U.S. Cl.
CPC .......... *H01L 21/6833* (2013.01); *C23C 24/04* (2013.01); *H05B 3/146* (2013.01)

(58) Field of Classification Search
CPC ... C23C 24/04; H05B 3/146; H01L 21/67109; H01L 21/6831; H01L 21/6833

USPC ..................................................... 219/444.1
See application file for complete search history.

(56) References Cited

U.S. PATENT DOCUMENTS

| | | | |
|---|---|---|---|
| 11,515,190 B2* | 11/2022 | Zhang | ..................... C23C 24/04 |
| 2002/0196596 A1 | 12/2002 | Parkhe et al. | |
| 2005/0042881 A1* | 2/2005 | Nishimoto | .......... H01L 21/6833 361/234 |
| 2006/0076108 A1 | 4/2006 | Holland et al. | |
| 2007/0065678 A1 | 3/2007 | Ko et al. | |
| 2009/0002913 A1 | 1/2009 | Naim | |

(Continued)

FOREIGN PATENT DOCUMENTS

| CN | 1779938 A | 5/2006 |
|---|---|---|
| JP | H05109876 A | 4/1993 |

(Continued)

OTHER PUBLICATIONS

Search Report Issued in corresponding Taiwan Application No. 109129211 dated May 17, 2023, 1 page.

(Continued)

*Primary Examiner* — Sang Y Paik
(74) *Attorney, Agent, or Firm* — Burris Law, PLLC

(57) ABSTRACT

A heating assembly includes a support member for supporting a target thereon, a diffuser layer attached to the support member, and a heater attached to the diffuser layer. The diffuser layer includes discrete diffuser segments separated by gaps. The discrete diffuser segments are made of the same material and are configured to allow a desired thermal gradient to be maintained between the discrete diffuser segments during heating of the target.

20 Claims, 6 Drawing Sheets

(56) References Cited

U.S. PATENT DOCUMENTS

| | | |
|---|---|---|
| 2010/0116788 A1 | 5/2010 | Singh et al. |
| 2012/0196242 A1 | 8/2012 | Volfovski et al. |
| 2013/0161305 A1* | 6/2013 | Ptasienski ............ H05B 1/0202 |
| | | 219/508 |

FOREIGN PATENT DOCUMENTS

| | | |
|---|---|---|
| JP | 2003243371 A | 8/2003 |
| JP | 2003243490 A | 8/2003 |
| JP | 2006140455 A | 6/2006 |
| JP | 2009291793 A | 12/2009 |
| JP | 2012508991 A | 4/2012 |
| JP | 2014510392 A | 4/2014 |
| JP | 2014130908 A | 7/2014 |
| JP | 2014529910 A | 11/2014 |
| JP | 2017041628 A | 2/2017 |
| JP | 2017174987 A | 9/2017 |
| KR | 1020060052119 A | 5/2006 |
| KR | 1020090001685 A | 1/2009 |
| KR | 1020180001685 A | 1/2018 |
| TW | 201737388 A | 10/2017 |
| TW | 201806441 A | 2/2018 |
| TW | 201921202 A | 6/2019 |

OTHER PUBLICATIONS

Notice of Allowance issued in corresponding KR Application No. 10-2022-7010171, and an English Translation, issued Jan. 25, 2023, 7 pages.

Office Action issued in corresponding CN Application No. 202080067700.6, dated Dec. 26, 2022, 5 pages.

Office Action issued in corresponding JP Application No. 2022513132, issued Sep. 24, 2024 and English Translation, 8 pages.

\* cited by examiner

THERMAL DIFFUSER FOR A SEMICONDUCTOR WAFER HOLDER

CROSS-REFERENCE TO RELATED APPLICATION

This application is a continuation of U.S. patent application Ser. No. 16/552,790 filed Aug. 27, 2019. The disclosure of the above application is incorporated herein by reference.

FIELD

The present disclosure relates to electrostatic chucks, and more generally to ceramic chucks with a plurality of heating zones.

BACKGROUND

The statements in this section merely provide background information related to the present disclosure and may not constitute prior art.

A wafer support assembly, such as an electrostatic chuck (also referred to herein as an "E-chuck"), may be used in semiconductor processing to support and hold a wafer thereon. For example, the E-chuck may include an electrostatic puck (also referred to herein as an "E-puck") that applies an electrostatic clamping force on the wafer. The E-chuck is generally exposed to high heat in a plasma processing chamber that performs various wafer processing/treatment steps, such as chemical vapor deposition (CVD), etching, sputtering, and ion implantation, among others. The E-chuck may be heated by a heater integrated in the E-chuck and a cooling device is generally disposed below the E-chuck to adjust or lower the temperature of the E-chuck during wafer processing or after wafer processing is completed. Throughout processing of the wafer, the E-chuck is subjected to wide and rapid temperature changes while the temperature of the wafer must be controlled to extremely tight tolerance such as less than about 0.5° C. during etching processes (e.g., processing temperatures up to about 120° C.) and less than about 5° C. during deposition processes (e.g., processing temperatures in the range of about 400-700° C.).

These issues of controlling the temperature of a wafer during semiconductor processing, among other issues related to the semiconductor processing, are addressed by the present disclosure.

SUMMARY

This section provides a general summary of the disclosure and is not a comprehensive disclosure of its full scope or all of its features.

In one form of the present disclosure, a heating assembly is provided, which includes a support member for supporting a target thereon, a diffuser layer attached to the support member, and a heater attached to the diffuser layer. The diffuser layer includes discrete diffuser segments separated by gaps. The discrete diffuser segments are made of the same material and are configured to allow a desired thermal gradient to be maintained between the discrete diffuser segments during heating of the target.

In other features, the diffuser layer is disposed between the support member and the heater. The discrete diffuser segments define continuous concentric rings, discontinuous concentric rings, or a combination thereof. The discrete diffuser segments are separated by at least one trench in the diffuser layer. The at least one trench extends partially through the diffuser layer or completely through the diffuser layer to the support member. The at least one trench defines a variable depth or a variable width. The support member is a ceramic material. The heater comprises at least two heating zones and the diffuser rings are axially aligned with the at least two heating zones such that the at least two heating zones are thermally decoupled from each other. The heater comprises an outer heating zone and an inner heating zone, and the diffuser rings are axially aligned with the outer heating zone and the inner heating zone to thermally decouple the outer heater zone from the inner heating zone such that a desired thermal gradient is maintained between the outer heater zone and the inner heating zone during heating of the target. The diffuser layer is formed from a material selected from the group consisting of aluminum, molybdenum, tungsten, nickel, zinc, silicon, and alloys thereof. The heater is selected from the group consisting of a foil heater, a layered heater, a damascene heater, and a polyimide heater. The heating assembly further includes a cooling plate attached to the heater. The diffuser layer is an aluminum diffuser layer with a thickness of less than 0.040 inches (1.02 mm). The support member is an E-puck including a substrate and at least one electrode embedded within the substrate.

In another form of the present disclosure, a heating assembly is provided, which includes a support member for supporting a target thereon, a diffuser layer disposed on the support member, a polyimide heater bonded to the diffuser layer, and a base plate bonded to the polyimide heater. The diffuser layer defines at least two diffuser rings arranged concentrically on the support member and defines predetermined intervals with spacing in a radial direction. The polyimide heater includes at least two heating zones. The at least two diffuser rings are disposed between the support member and the polyimide heater, are made of the same material, and are axially aligned with the at least two heating zones to thermally decouple the at least two heating zones such that a desired thermal gradient is maintained between the at least two diffuser rings during heating of the target.

In other features, the at least two heating zones include an outer heating zone and an inner heating zone, and a desired thermal gradient is maintained between the outer heater zone and the inner heating zone during heating of the target on the support member. The support member is bonded to the polyimide heater with a first elastomer layer and the polyimide heater is bonded to the base plate with a second elastomer layer.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 2A:
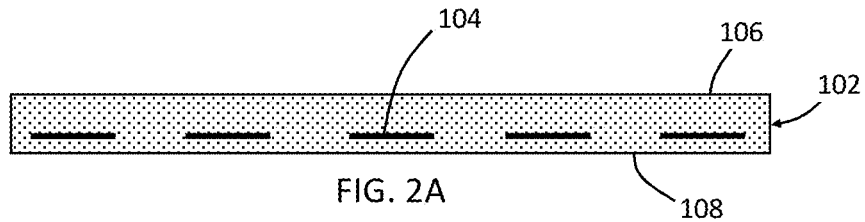
Figure 2B:
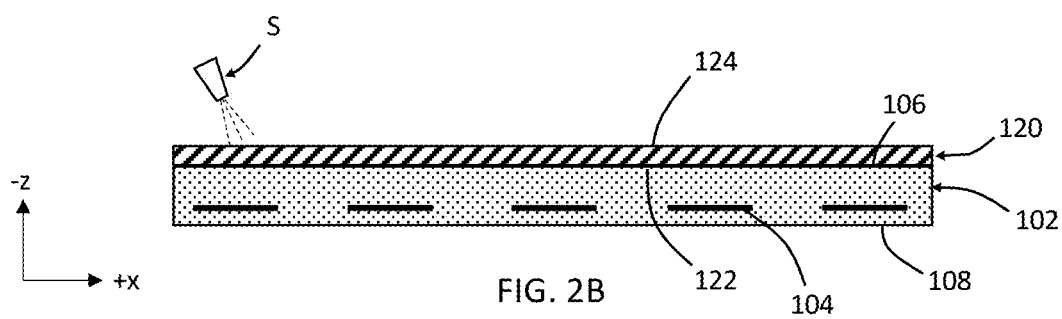
Figure 2C:
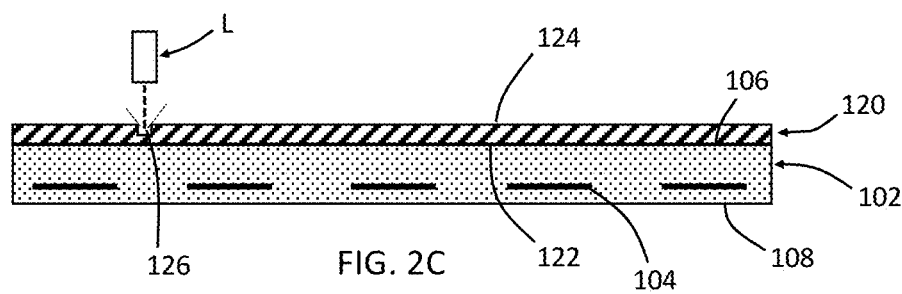
Figure 2D:
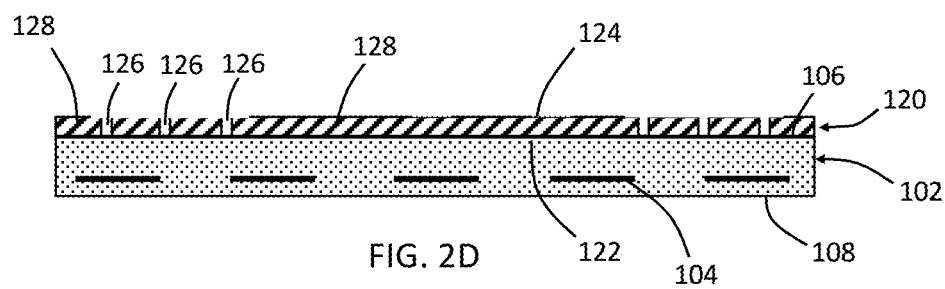
Figure 2E:
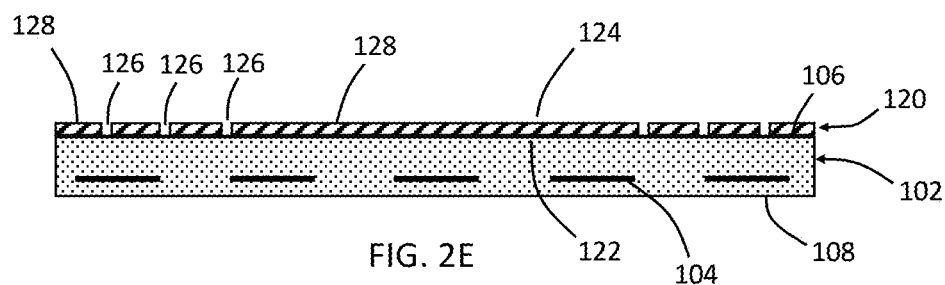
Figure 2F:
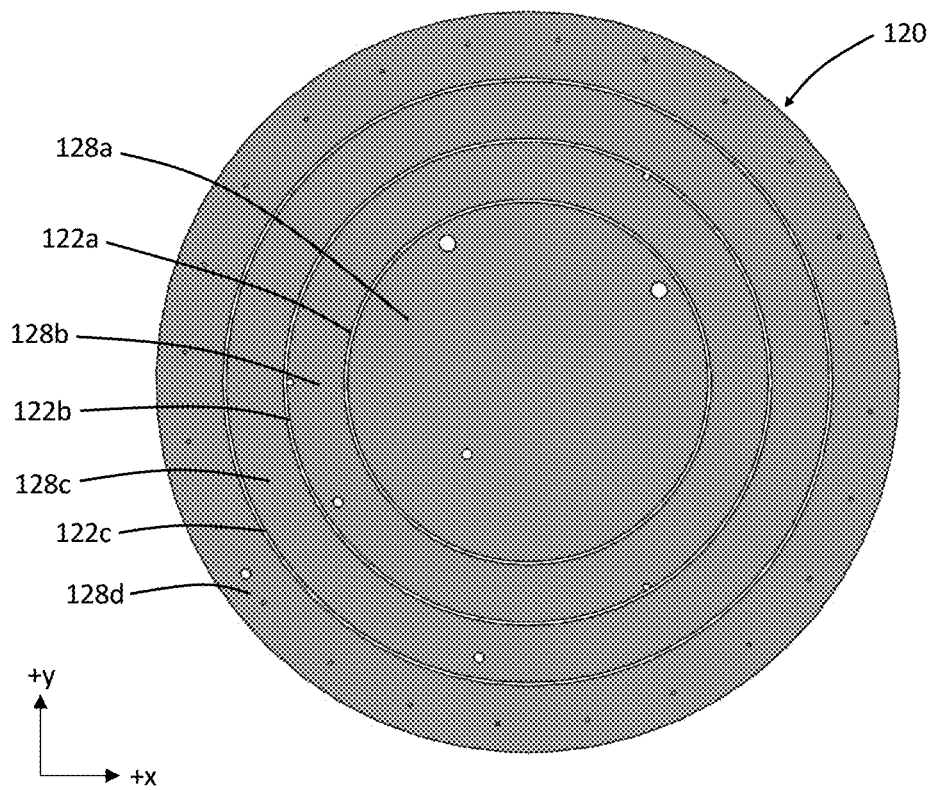
Figure 2G:
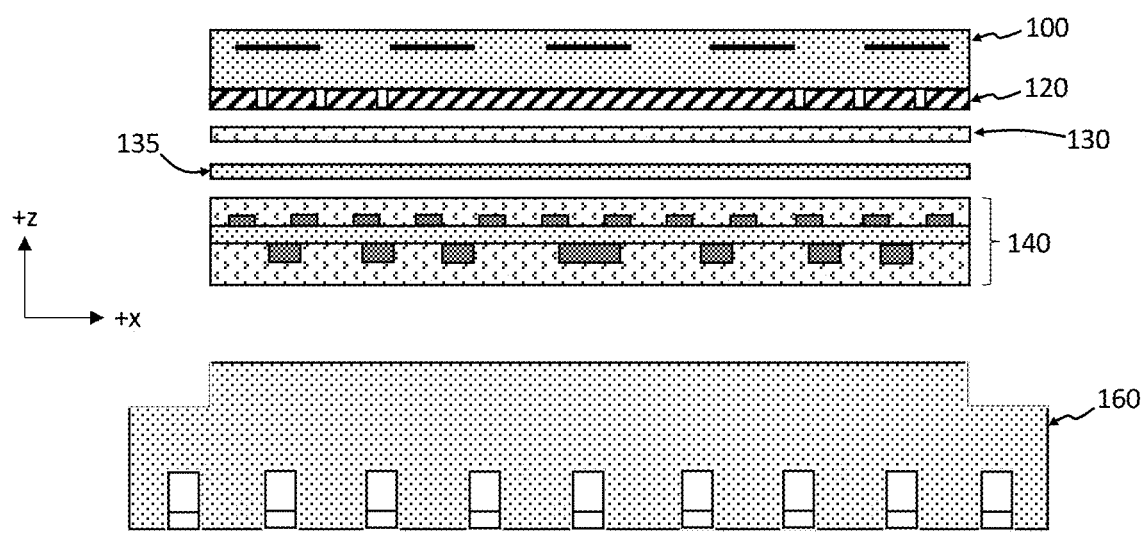
Figure 3A:
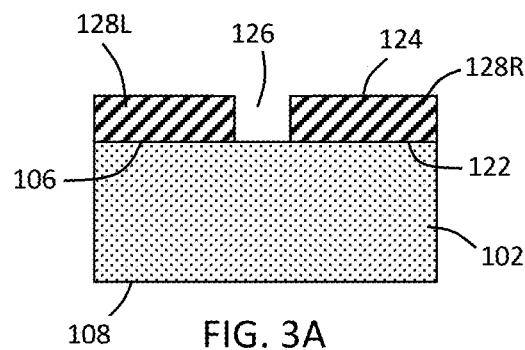
Figure 3B:
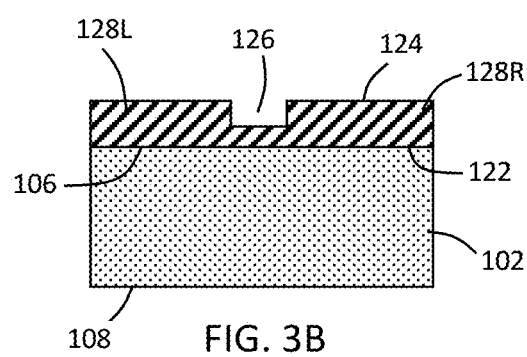
Figure 3C:
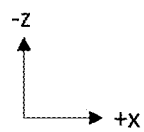
Figure 3C:
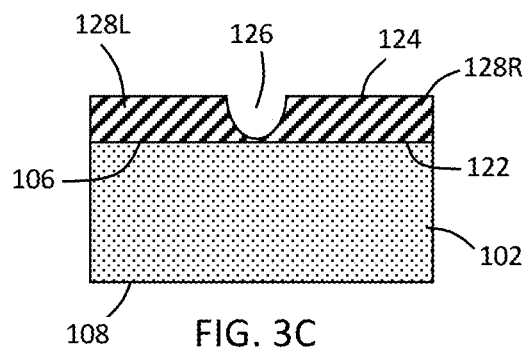
Figure 3D:
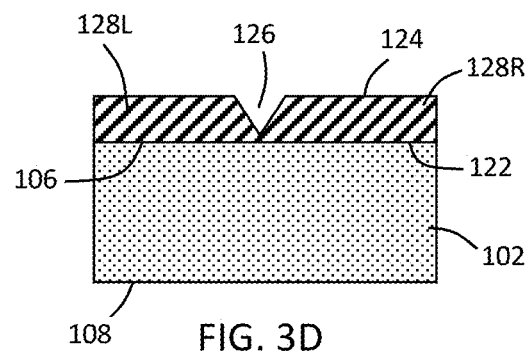
Figure 4:
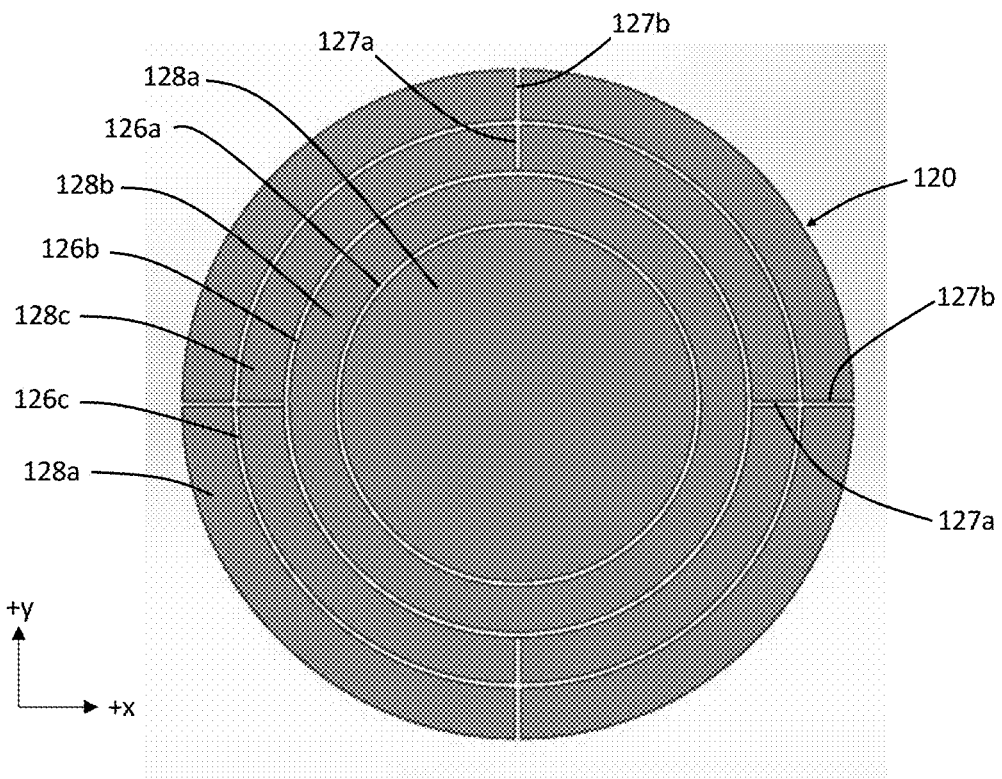
Figure 5:
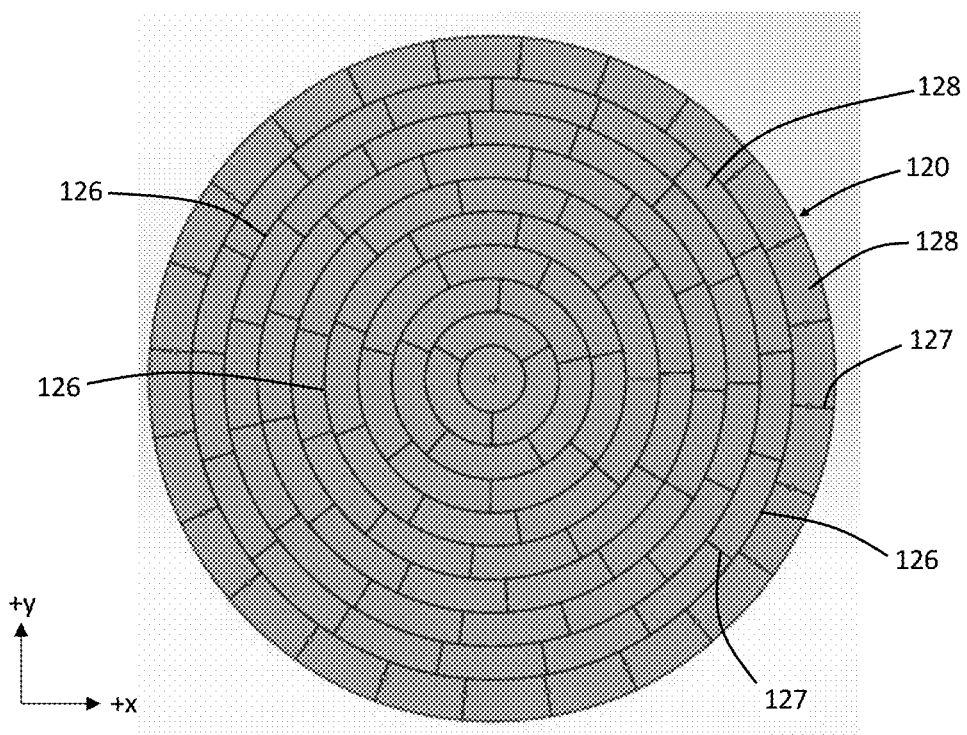
Figure 6:
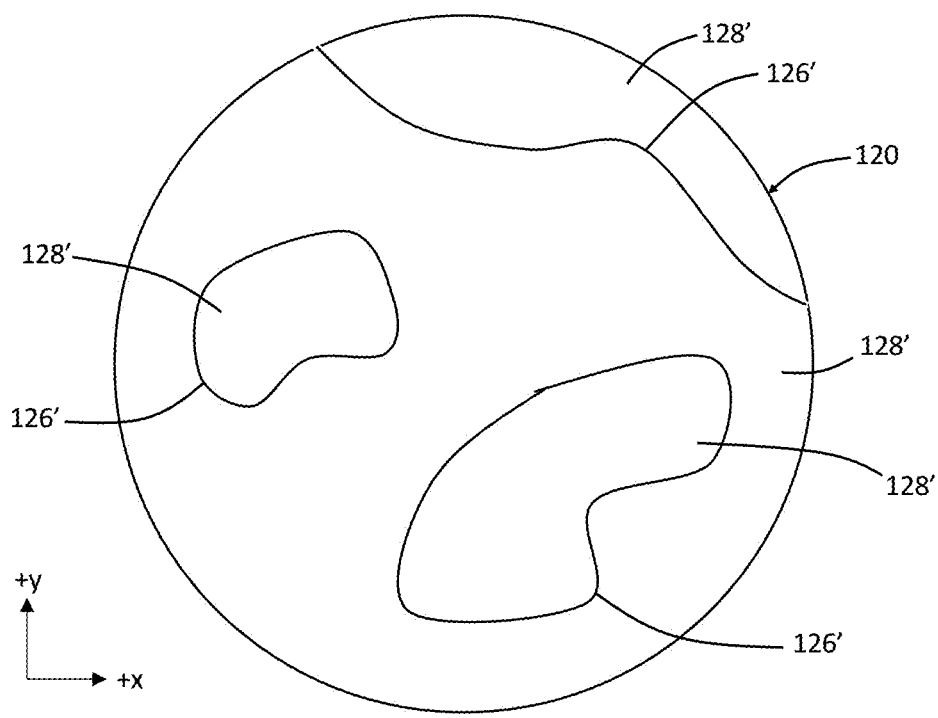
Figure 7:
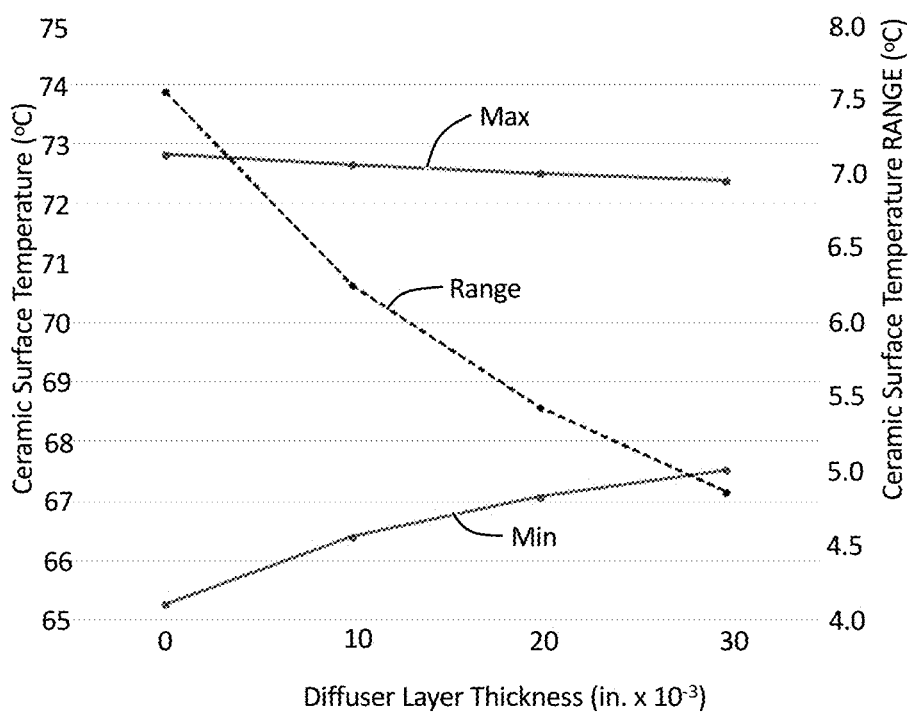

FIG. 2A to FIG. 2G depict a series of steps for a method of manufacturing an E-chuck in accordance with the teachings of the present disclosure where: FIG. 2A is a cross-sectional view of an E-puck; FIG. 2B is a cross-sectional view of the E-puck in FIG. 2A with a diffuser layer being formed thereon; FIG. 2C is a cross-sectional view of the E-puck in FIG. 2B with trenches being formed in the diffuser layer; FIG. 2D is a cross-sectional view of the E-puck in FIG. 2C with discrete diffuser segments formed in the diffuser layer; FIG. 2E is a cross-sectional view of the E-puck in FIG. 2D with the diffuser layer machined to a reduced thickness; FIG. 2F is a top view of the E-puck in FIG. 2E with discrete diffuser segments formed in the diffuser layer; FIG. 2G is a cross-sectional view of an assembly of the E-puck in FIG. 2F with a heater and a cooling plate;

FIG. 3A to FIG. 3D depict a series of diffuser layers with trenches forming discrete diffuser segments where: FIG. 3A is a cross-sectional view of a rectangular shaped trench extending into and through a diffuser layer; FIG. 3B is a cross-sectional view of a rectangular shaped trench extending into a diffuser layer; FIG. 3C is a cross-sectional view of a hemispherical-shaped trench extending into a diffuser layer; and FIG. 3D is a cross-sectional view a v-shaped trench extending into a diffuser layer;

FIG. 4 is a plan view of a diffuser layer with discrete diffuser segments in accordance with one form of the present disclosure;

FIG. 5 is a plan view of a diffuser layer with discrete diffuser segments in accordance with another form of the present disclosure;

FIG. 6 is a plan view of a diffuser layer with discrete diffuser segments in accordance with yet another form of the present disclosure; and FIG. 7 is a graph showing E-puck ceramic surface temperature and E-puck ceramic surface temperature range as a function of diffuser layer thickness in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. Examples are provided to fully convey the scope of the disclosure to those who are skilled in the art. Numerous specific details are set forth such as types of specific components, devices, and methods, to provide a thorough understanding of variations of the present disclosure. It will be apparent to those skilled in the art that specific details need not be employed and that the examples provided herein, may include alternative embodiments and are not intended to limit the scope of the disclosure. In some examples, well-known processes, well-known device structures, and well-known technologies are not described in detail.

Figure 1A:
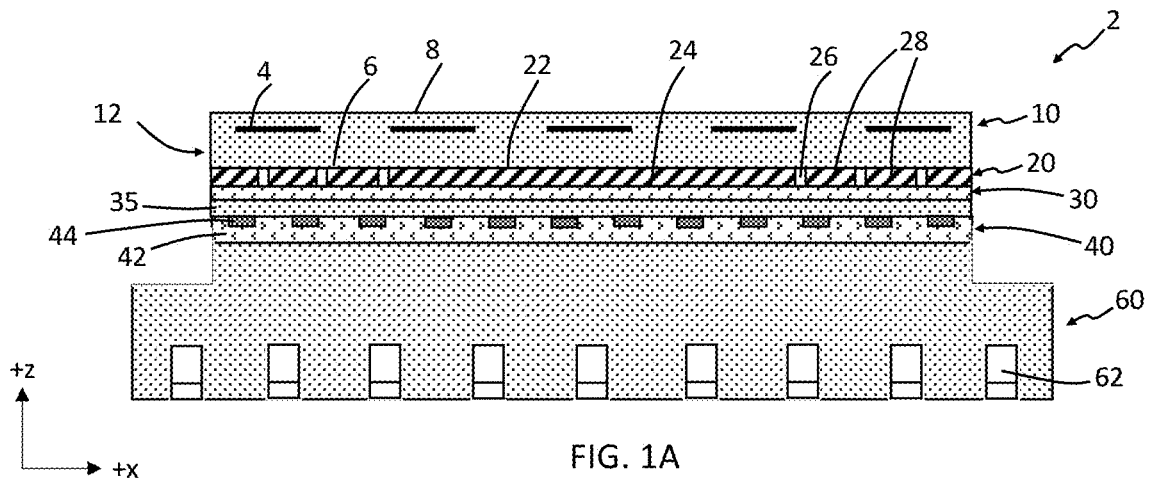
FIG. 1A is a cross-sectional view of an E-chuck constructed in accordance with one form of the present disclosure.

Referring to FIG. 1A, an E-chuck 2 constructed in accordance with one form of the present disclosure is shown. The E-chuck 2 comprises an E-puck 10, a diffuser layer 20, an upper bond layer 30, a heater 40 for generating heat, a lower bond layer 42, and a cooling plate 60. In this form, the heater 40 is an etched foil heater that includes a polyimide layer 35 (or an "inter-layer dielectric") and an etched foil heater circuit 44 on the polyimide layer 35. It should be understood, however, that other heater constructions may be employed while remaining within the scope of the present disclosure. Further, both the upper and lower bond layers 30/42 may be optional if an appropriate dielectric is provided around the heater circuit 44 and that can be secured directly to the diffuser layer 20 and the cooling plate 60.

Generally, the E-chuck 2 is used as a part of a support member in a semiconductor processing pedestal assembly. However, it should be understood that the teachings of the present disclosure may be employed in other applications besides semiconductor processing equipment, such as by way of example, industrial manufacturing equipment, cooktops, and medical devices, among others, while remaining within the scope of the present disclosure.

The E-puck 10 includes a substrate 12 and an electrode 4 embedded within the substrate 12. The substrate 12 defines a first surface 6 and a second surface 8, the latter of which is for heating a target (i.e., wafer) thereon. In at least one form of the present disclosure, the substrate 12 is formed from a ceramic material such as an aluminum oxide ($Al_2O_3$) or aluminum nitride (AlN). However, it should be understood that other ceramic materials, or materials other than ceramic may be employed while remaining within the scope of the present disclosure.

The diffuser layer 20 is disposed between the E-puck 10 and the heater 40. The diffuser layer 20 defines a first surface 22 and a second surface 24. The first surface 22 is disposed directly on the first surface 6 of the E-puck 10, and the second surface 24 is disposed on the heater 40. In one variation, the second surface 24 of the diffuser layer 20 is disposed directly on the inter-layer dielectric 35 of the heater 40, such that the heater 40 is directly secured to the diffuser layer 20. In another variation, a bonding layer 30 is disposed between the diffuser layer 20 and the heater 40 to secure the heater 40 to the diffuser layer 20.

As further shown, the diffuser layer 20 includes at least one trench or gap 26. The trench 26 results in or forms discrete diffuser segments 28 within the diffuser layer 20, which are described in greater detail below. Generally, the diffuser layer 20 enhances temperature uniformity across the second surface 8 of the E-puck 10, while the discrete diffuser segments 28 allow a desired thermal gradient to be maintained between the segments during heating of a target on the E-puck 10, the operation of which is described in greater detail below.

Figure 1B:
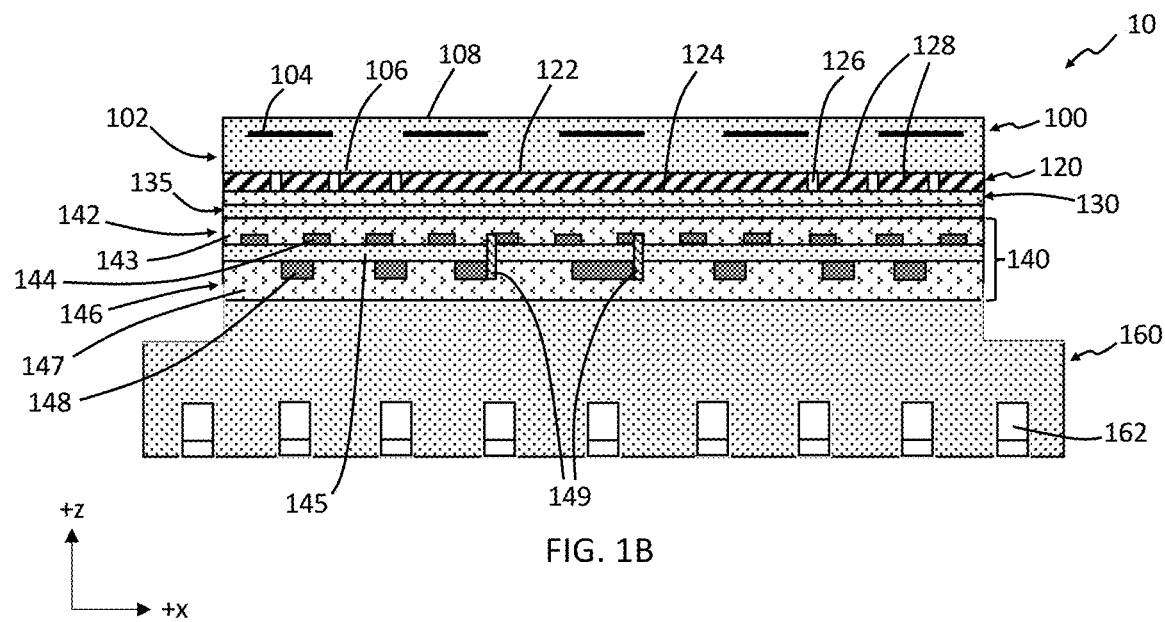
FIG. 1B is a cross-sectional view of an E-chuck constructed in accordance with another form of the present disclosure.

Referring to FIG. 1B, an E-chuck 10 constructed in accordance with another form of the present disclosure, which generally includes a routing layer, is shown. The E-chuck 10 generally comprises an E-puck 100, a diffuser layer 120, a dielectric layer 135, a heater 140 for generating heat, a routing layer 146, and a cooling plate 160.

The E-puck 100 includes a substrate 102 and an electrode 104 embedded within the substrate 102. The substrate 102 defines a first surface 106 and a second surface 108 for heating a target thereon. In at least one form of the present disclosure, the substrate 102 is formed from a ceramic material such as an aluminum oxide ($Al_2O_3$) or aluminum nitride (AlN).

The diffuser layer 120 is disposed between the E-puck 100 and the dielectric layer 135. The diffuser layer 120 defines a first surface 122 and a second surface 124. The first surface 122 is disposed directly on the E-puck 100 and the second surface 124 is disposed on the dielectric layer 135.

As further shown, the diffuser layer 120 includes at least one trench or gap 126. The trench 126 results in or forms discrete diffuser segments 128 within the diffuser layer 120, which are also shown in more detail in FIGS. 3-6. As discussed in greater detail below, the diffuser layer 120 enhances temperature uniformity across the second surface 108 of the E-puck 100 while the discrete diffuser segments 128 allow a desired thermal gradient to be maintained between the segments during heating of a target on the E-puck 100.

The dielectric layer 135 is disposed between the diffuser layer 120 and the heater 140. In at least one variation of the present disclosure, a bonding layer 130 is disposed between the diffuser layer 120 and the dielectric layer 135. It should be understood that the bonding layer 130 bonds or attaches the E-puck 100 with the diffuser layer 120 to the dielectric layer 135. It should be understood, however, that the diffuser layer 120 may be directly disposed on the E-puck 100 without a bonding layer 130 while remaining within the scope of the present disclosure. In such a form, the diffuser layer 120 may be thermally sprayed, by way of example, directly to the E-puck 100.

The heater 140 is disposed between the dielectric layer 135 and the cooling plate 160. In at least one form of the present disclosure, the heater 140 includes a heating layer 142, an inter-layer dielectric 145, and a routing layer 146, and the inter-layer dielectric 145 is disposed between the heating layer 142 and the routing layer 146. The heating layer 142 includes a heating layer substrate 143, which is a thin layer of elastomer in one form of the present disclosure (approximately 0.001 in.-0.002 in.) and functions to affix at least one heating element 144 to the dielectric layer 135. The routing layer 146 includes a routing layer substrate 147, which is a dual function material that provides dielectric strength while bonding the routing layer 146 to the cooling plate 160. As shown, the routing layer 146 includes at least one routing element 148. At least one via interconnect 149 is disposed between the heating layer 142 and the routing layer 146 such that the at least one heating element 144 is in electrical connection with the at least one routing element 148, thus enabling multiple heating zones as shown and described in greater detail below. While FIG. 1B shows the heater 140 with an upper (+z direction) heating layer 142 and a lower (-z direction) routing layer 146, it should be understood that the heating layer 142 and routing layer 146 can be in any order provided the diffuser layer 120 is disposed directly on the E-puck 100. For example, the heating layer 142 can be positioned below (-z direction) the inter-layer dielectric 145 and the routing layer 146 can be positioned above (+z direction) the inter-layer dielectric 145. It should also be understood that other functional layers, by way of example, a sensor layer, may be provided in addition to those shown and described.

In one form, the cooling plate 160 comprises cooling channels 162, through which a cooling fluid flows, such that heat from the heater 140, and other components or targets associated with the E-chuck 10, can be dissipated away from the E-puck 100 during semiconductor processing of one or more wafers.

While FIG. 1B shows only one bonding layer, i.e., bonding layer 130, it should be understood that more than one bonding layer can be included and disposed between the various layers of the E-puck 10. For example, a bonding layer (not shown) can be disposed between heater 140 and the cooling plate 160.

Referring now to FIGS. 2A-2G, a method of manufacturing E-chuck 10 according to the teachings of the present disclosure is provided. The method includes providing the E-puck 100 with the at least one electrode 104 embedded within the substrate 102 as shown in FIG. 2A and forming a diffuser layer 120 on the first surface 106 as shown in FIG. 2B. The diffuser layer 120 includes a first surface 122, a second surface 124, and a thickness (z-direction, not labeled) between the first surface 122 and the second surface 124. In at least one variation of the present disclosure, the first surface 122 of the diffuser layer 120 is disposed directly on the first surface 106 of the E-puck 100, while in other variations the first surface 122 of the diffuser layer 120 is not disposed directly on the first surface 106 of the E-puck 100. For example, one or more additional layers (not shown) are disposed between the first surface 122 of the diffuser layer 120 and the first surface 106 of the E-puck 100. It should be understood that the diffuser layer 120 can be deposited using any known or yet to be developed material layer deposition technique(s). Non-limiting examples of material layer deposition techniques include cathodic arc discharge, cold spray, chemical vapor deposition (CVD) techniques, physical vapor deposition (PVD) techniques, sol-gel techniques, sputtering, and vacuum plasma spray, among others. In one form of the present disclosure, a cold spray apparatus 'S' is used to deposit aluminum onto the first surface 106 of the E-puck 100.

The diffuser layer 120 is formed from a material with a high thermal conductivity. As used herein the phrase "high thermal conductivity" refers to a thermal conductivity greater than 10 W/m·K, for example, greater than 50 W/m·K or greater than 100 W/m·K. Non-limiting examples of materials used to form the diffuser layer 120 include aluminum, copper, silver, gold, nickel and alloys thereof, among others. Other non-limiting examples of materials used to form the diffuser layer 120 include diamond-like carbon (DLC) and AlN, among others. Also, the diffuser layer 120 has a thickness between about 0.005 inches (0.13 mm) and about 0.100 inches (2.54 mm). For example, in one variation the diffuser layer 120 has a thickness between about 0.010 (0.25 mm) inches and about 0.020 (0.51 mm) inches. In another variation, the diffuser layer 120 has a thickness between about 0.020 inches (0.51 mm) and about 0.030 inches (0.76 mm). In still another variation, the diffuser layer 120 has a thickness between about 0.030 inches (0.76 mm) and about 0.040 inches (1.02 mm).

The diffuser layer 120 may have a monolithic composition along its thickness (z direction), or in the alternative, a graded composition (or a varying coefficient of thermal expansion (CTE)) through its thickness (z direction) such that the thermal expansion mismatch between the first surface 122 of the diffuser layer 120 and the first surface 106 of the E-puck 100 is reduced. In one variation, the diffuser layer 120 has a first thickness (not labeled) adjacent to the first surface 106 of the substrate 102 and a second thickness (not labeled) distal from (further away) the first surface 106 compared to the first thickness. The first thickness has a first composition and the second thickness has a second composition different than the first composition. Also, the first composition has a first coefficient of the thermal expansion (CTE) and the second composition has a second CTE different than the first CTE. One non-limiting example includes a substrate 102 formed from alumina and a diffuser layer 120 with a first thickness (not labeled) having a first composition extending from the first surface 106 towards the second surface 108 and a second thickness (not labeled) having a second composition extending from the first thickness towards the second surface 108. The first thickness is about 10-15 μm and the first composition has a CTE of about 1.1 times the CTE for alumina. The second thickness is about 25-50 μm and the second composition has a CTE of about 1.2 times the CTE for alumina. It should be understood that additional thicknesses with different compositions (and different CTEs) can be included in the diffuser layer 120 such that the diffuser layer has a gradient of CTE values. It should also be understood that the entire diffuser layer 120 can have a continuously changing composition from the first surface 122 to the second surface 124 such that the diffuser layer 120 has a gradient CTE from the first surface 122 to the second surface 124.

Referring now to FIG. 2C, at least one trench 126 (also referred to herein as a "gap") is formed in the diffuser layer 120. The trench 126 extends from the second surface 124 of the diffuser layer 120 towards the first surface 106 of the E-puck 100. In some variations of the present disclosure, one or more trenches 126 extend completely through the diffuser layer 120, i.e., from the second surface 126 of the diffuser layer 120 to the first surface 106 of the E-puck 100, while in other variations one or more trenches 126 extend only partially through the diffuser layer 120. In still other variations, one or more trenches 126 have at least one portion (not shown) where the trench 126 extends completely through the diffuser layer 120 and at least one other portion where the trench 126 extends only partially through the diffuser layer 120. In one form of the present disclosure, the at least one trench is formed with a laser 'L', e.g., by laser machining.

It should be understood that the at least one trench 126, and other trenches disclosed herein, can be formed using any known or yet to be developed material removal technique. Non-limiting examples of material removal techniques include grinding, laser cutting, etching, machining, photolithography, and sand or grit blasting, among others. It should also be understood that while FIGS. 2B and 2C depict the diffuser layer with at least one trench 126 being formed by depositing the diffuser layer 120 and then removing material to form the trench 126, other techniques or methods can be used to form the diffuser layer 120 and trenches 126. For example, in one variation, the first surface 106 is masked (not shown) to cover the locations or positions of the trenches 126, the diffuser layer 120 is deposited onto the first surface 106, and then the mask is removed to reveal the trenches 126 in the diffuser layer 120. In the alternative, or in addition to, the diffuser layer 120 with the trenches 126 is formed with an additive manufacturing technique (e.g., 3D printing) without any masking or subsequent removal process as described herein.

Referring now to FIGS. 2D and 2E, the method includes forming a plurality of trenches 126 such that discrete diffuser segments 128 are formed and separated by the trenches 126, and machining the diffuser layer 120 (FIG. 2E) such that a generally flat second surface 124 that is generally parallel to the second surface 108 of the E-puck 100 is provided. That is, the second surface 126 is machined such that a flat diffuser layer 120 is provided at an interface where the heater 140 is to be secured. Non-limiting examples of machining techniques or processes for machining the diffuser layer include lapping, polishing, and chemical mechanical polishing (CMP), among others. While FIG. 2E depicts machining of the diffuser layer 120 after the at least one trench 126 is formed, it should be understood that the diffuser layer 120 can be machined before the at least one trench 126 is formed or during the same process as forming the trenches.

FIG. 2F shows a completed diffuser layer 120 with a central or first discrete diffuser segment 128a separated from a second discrete diffuser segment 128b by a trench 122a, a third discrete diffuser segment 128c separated from the second discrete diffuser segment 128b by a trench 122b, and a fourth discrete diffuser segment 128d separated from the third discrete diffuser segment 128c by a trench 122c.

Referring now to FIG. 2G, the method includes assembling E-puck 100 with the diffuser layer 120, the dielectric layer 135, the heater 140 and the cooling plate 160 to provide the E-chuck 10 shown in FIG. 1B. Particularly, the E-puck 100 with the diffuser layer 120 is bonded to the dielectric layer 135, the dielectric layer is bonded to the heater 140, and the heater 140 is bonded to the cooling plate 160. In at least one variation of the present discloser, the bonding layer 130 is disposed between the diffuser layer 120 and the heater 140. Also, additional bonding layers can be disposed between the various layers of the E-chuck 10. It should be understood that the at least one trench 126 may be filled with air, an elastomer material, a dielectric material, and/or a bonding material such that a low thermal conductivity gap is between adjacent discrete diffuser segments 128.

The dielectric layer 135 electrically isolates the heater 140 from the diffuser layer 120. Non-limiting examples of materials used to form the dielectric layer 135 include elastomers, polyimide, thermally sprayed dielectrics (e.g., $Al_2O_3$, yttria), thick film dielectrics, liquid polyimide, and other dielectric polymers, among others. The heater 140 can be any heater known or yet to be developed to provide heat to and for use with an E-chuck. Non-limiting examples of the heater 140 include a polyimide foil heater, a layered heater, or a damascene heater, among others. In at least one form of the present disclosure, the heater 140 includes the inter-layer dielectric 145 disposed between an elastomer heating layer substrate 143 and an elastomer routing layer substrate 147.

Referring now to FIGS. 3A-3D, non-limiting examples of trenches 126 formed in the diffuser layer 120 are shown. For example, FIG. 3A shows a rectangular-shaped trench 126 extending from the second surface 124 of the diffuser layer 120 to the first surface 106 of the E-puck 100, i.e., the rectangular-shaped trench 126 in FIG. 3A extends completely through the diffuser layer 120 such that discrete diffuser segments 128L and 128R are separated by a trench. In the alternative, FIG. 3B shows a rectangular-shaped trench 126 extending from the second surface 124 of the diffuser layer 120 towards but not completely to the first surface 106 of the E-puck 100, i.e., the rectangular-shaped trench 126 in FIG. 3A extends only partially through the diffuser layer 120 such that discrete diffuser segments 128L and 128R are separated by a trench. FIG. 3C shows a hemispherical-shaped trench 126 extending into the diffuser layer 120 and FIG. 3D shows a v-shaped trench 126 extending into the diffuser layer 120 such that discrete diffuser segments 128L and 128R are separated by a trench. It should be understood that the trench 126 can have other shapes that extend completely or partially through the diffuser layer 120 such that discrete diffuser segments are separated by a trench.

While FIG. 2E shows the diffuser layer 120 with radially disposed discrete diffuser segments 128a-128d, it should be understood that the diffuser layer 120 can include azimuthal disposed discrete diffuser segments. For example, and with reference to FIG. 4, the diffuser layer 120 includes a central discrete diffuser segment 128a separated from a first radial discrete diffuser segment 128b by a trench 126a and a plurality of second radial discrete diffuser segments 128c separated from the first radial discrete diffuser segment 128b by a trench 126b, and azimuthally separated from each other by trenches 127a. As shown in FIG. 4, in one variation the plurality of second radial discrete diffuser segments 128c includes four (4) second radial discrete diffuser segments 128c, however, it should be understood that the number of second radial discrete diffuser segments 128c can be less than four or more than four. Also, a plurality of third radial discrete diffuser segments 128d are separated from the second radial discrete diffuser segments 128c by a trench 126c, and azimuthally separated from each other by trenches 127b. As shown in FIG. 4, in one variation the plurality of third radial discrete diffuser segments 128d includes four (4) third radial discrete diffuser segments 128d, however, it should be understood that the number of third radial discrete diffuser segments 128d can be less than four or more than four. In addition, it should also be understood that the diffuser layer 120 can include any number of radial discrete diffuser segments and any number of azimuthal discrete diffuser segments. For example, the diffuser layer 120 shown in FIG. 5 includes a central discrete diffuser segment 128 and nine (9) radial discrete diffuser segments 128 separated by trenches 126, and up to twenty-four (24) azimuthal discrete diffuser segments 128 within a given radial discrete diffuser segment separated by trenches 127. In addition, adjacent radial discrete diffuser segments can be aligned as shown in FIG. 4 or be offset from each other as shown in FIG. 5.

While FIGS. 2E, 4 and 5 show the diffuser layer 120 with regular shaped discrete diffuser segments 128 comprising a generally constant radial width and/or azimuthal length, it should be understood that in some variations of the present disclosure the diffuser layer 120 includes irregular shaped discrete diffuser segments. For example, FIG. 6 shows a diffuser layer 120 with a plurality of irregular-shaped discrete diffuser segments 128' separated by trenches or trenches 126'.

Referring now to FIG. 7, results from a Finite Element Analysis (FEA) of temperature of an outer surface (e.g., second surface 108) of a substrate and temperature range of the outer surface as a function of diffuser layer thickness (+z direction in FIG. 1) are shown. Particularly, FEA of an alumina substrate heated to an average temperature of about 79° C. was performed for no diffuser layer, a 0.010 inch thick diffuser layer, a 0.020 inch thick diffuser layer, and a 0.030 inch thick diffuser layer. From the FEA, the maximum temperature, the minimum temperature and the range of temperature (i.e., maximum temperature−minimum temperature) was determined and is plotted in FIG. 7. As shown in FIG. 7, a diffuser layer 0.030 inches thick reduced the range of temperature of the outer surface from about 7.6° C. to about to about 4.8° C., i.e. almost 40%.

Accordingly, each discrete diffuser segment enhances temperature uniformity of a particular region or area of an E-puck outer surface while the trenches provide at least a partial thermal decoupling of the discrete diffuser segments from each other such that a desired thermal gradient (e.g., 20° C. from center to edge of a discrete diffuser segment 128) is maintained between the segments during heating of a target on the E-puck. The term "at least a partial thermal decoupling" (and variations thereof) should be construed to mean that a thermal conductivity of the trenches/gaps 26/126 between diffuser segments 28/128 is less than, or independent from, a thermal conductivity of the adjacent diffuser segments 128. For example, the trenches/gaps 26/126 may have approximately 50% or less of the thermal conductivity of the diffuser segments 28/128 while remaining within the scope of the present disclosure.

Further, while the diffuser segments 28/128 are illustrated herein as taking on an arcuate geometry, it should be understood that any shape or combination of shapes, whether the same or different in a given diffuser layer 20/120, may be employed in order to provide a desired thermal gradient across the E-puck 10/100 while remaining within the scope of the present disclosure.

It should be understood from the figures and the discussion above that an E-chuck with a diffuser layer that enhances temperature uniformity across the surface of an E-puck, thereby enhancing temperature uniformity of a target on the E-puck, is provided. Also, the diffuser layer includes discrete diffuser segments that are thermally decoupled from each other, e.g., via trenches or gaps between the discrete diffuser segments, such that a desired thermal gradient between the segments is maintained during heating of the target on the E-puck. The combination of the enhanced E-puck surface temperature uniformity and thermal gradient control between or across areas or portions of the E-puck surface provides enhanced process control during semiconductor wafer processing.

When an element or layer is referred to as being "on," "engaged to," or "disposed on" another element or layer, it may be directly on, engaged, connected or disposed on the other element or layer, or intervening elements or layers may be present. In contrast, when an element is referred to as being "directly on," "directly engaged to," "directly connected to," or "directly disposed on" another element or layer, there may be no intervening elements or layers present. Other words used to describe the relationship between elements should be interpreted in like fashion (e.g., "between" versus "directly between," "adjacent" versus "directly adjacent," etc.). As used herein, the term "and/or" includes any and all combinations of one or more of the associated listed items.

Although the terms first, second, third, etc. may be used to describe various elements, components, regions, layers and/or sections, these elements, components, regions, layers and/or sections, should not be limited by these terms. These terms may be only used to distinguish one element, component, region, layer and/or section, from another element, component, region, layer and/or section. Terms such as "first," "second," and other numerical terms when used herein do not imply a sequence or order unless clearly indicated by the context. Thus, a first element, component, region, layer or section, could be termed a second element, component, region, layer or section without departing from the teachings of the example forms. Furthermore, an element, component, region, layer or section may be termed a "second" element, component, region, layer or section, without the need for an element, component, region, layer or section termed a "first" element, component, region, layer or section.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above or below. The device may be otherwise oriented (rotated 90 degrees or at other orientations) and the spatially relative descriptors used herein interpreted accordingly.

As used herein, the phrase at least one of A, B, and C should be construed to mean a logical (A OR B OR C), using a non-exclusive logical OR, and should not be construed to mean "at least one of A, at least one of B, and at least one of C.

Unless otherwise expressly indicated, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, examples that do not depart from the substance of the disclosure are intended to be within the scope of the disclosure. Such examples are not to be regarded as a departure from the spirit and scope of the disclosure. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A heating assembly comprising:
   a support member for supporting a target thereon;
   a diffuser layer attached to the support member, wherein the diffuser layer includes discrete diffuser segments separated by gaps, the gaps configured to thermally decouple the discrete diffuser segments; and
   a heater attached to the diffuser layer and defining at least two heating zones which generate a predetermined thermal gradient,
   wherein the discrete diffuser segments are made of the same material and correspond to the at least two heating zones, the gap being disposed immediately above a boundary between the at least two heating zones and thermally decoupling heat that is transferred to the at least two diffuser segments from the at least two heating zones such that the predetermined thermal gradient generated in the at least two heating zones is maintained in the diffuser layer during heating of the target.

2. The heating assembly according to claim 1, wherein the diffuser layer is disposed between the support member and the heater.

3. The heating assembly according to claim 1, wherein the discrete diffuser segments define continuous concentric rings.

4. The heating assembly according to claim 1, wherein the discrete diffuser segments define discontinuous concentric rings.

5. The heating assembly according to claim 1, wherein the discrete diffuser segments define a combination of continuous concentric rings and discontinuous concentric rings.

6. The heating assembly according to claim 1, wherein at least one of the gaps extends partially through the diffuser layer.

7. The heating assembly according to claim 1, wherein at least one of the gaps extends completely through the diffuser layer to the support member.

8. The heating assembly according to claim 1, wherein at least one of the gaps defines a variable depth.

9. The heating assembly according to claim 1, wherein at least one of the gaps defines a variable width.

10. The heating assembly according to claim 1, wherein the support member is a ceramic material.

11. The heating assembly according to claim 1, wherein the discrete diffuser segments are axially aligned with the at least two heating zones.

12. The heating assembly according to claim 1, wherein the heater comprises an outer heating zone and an inner heating zone, and the discrete diffuser segments are axially aligned with the outer heating zone and the inner heating zone to thermally decouple the heat that is transferred to the discrete diffuser segments from the outer heating zone and the inner heating zone such that the predetermined thermal gradient generated in the inner heating zone and the outer heating zone is maintained in the diffuser layer during heating of the target.

13. The heating assembly according to claim 1, wherein the diffuser layer is formed from a material selected from the group consisting of aluminum, molybdenum, tungsten, nickel, zinc, silicon, and alloys thereof.

14. The heating assembly according to claim 1, wherein the heater is selected from the group consisting of a foil heater, a layered heater, a damascene heater, and a polyimide heater.

15. The heating assembly according to claim 1 further comprising a cooling plate attached to the heater.

16. The heating assembly according to claim 1, wherein the diffuser layer is an aluminum diffuser layer with a thickness of less than 0.040 inches (1.02 mm).

17. The heating assembly according to claim 1, wherein the support member is an E-puck including a substrate and at least one electrode embedded within the substrate.

18. A heating assembly comprising:
   a support member for supporting a target thereon;
   a diffuser layer disposed on the support member, wherein the diffuser layer defines at least two diffuser rings arranged concentrically on the support member and separated by at least one gap in a radial direction;
   a polyimide heater bonded to the diffuser layer and comprising at least two heating zones that generate a predetermined thermal gradient, wherein the at least two diffuser rings are disposed between the support member and the polyimide heater and correspond to the at least two heating zones; and
   a base plate bonded to the polyimide heater,
   wherein the at least two diffuser rings are made of the same material, and are axially aligned with the at least two heating zones, the at least one gap being disposed immediately above a boundary between the at least two heating zones, and thermally decoupling heat that is transferred to adjacent ones of the at least two diffuser rings from the at least two heating zones such that the predetermined thermal gradient generated in the at least two heating zones is maintained in the diffuser layer during heating of the target.

19. The heating assembly according to claim 18, wherein the at least two heating zones comprise an outer heating zone and an inner heating zone, and the predetermined thermal gradient is maintained between the outer heater zone and the inner heating zone during heating of the target on the support member.

20. The heating assembly according to claim 18, wherein the support member is bonded to the polyimide heater with a first elastomer layer and the polyimide heater is bonded to the base plate with a second elastomer layer.

* * * * *